United States Patent [19]

Joosten et al.

[11] Patent Number: 4,868,675
[45] Date of Patent: Sep. 19, 1989

[54] CONTROL CIRCUIT FOR A LASER PRINTER

[75] Inventors: Louis G. J. Joosten, Helden; Matheas T. M. Stemkens, Baarlo, both of Netherlands

[73] Assignee: Oce-Nederland B.V., Venlo, Netherlands

[21] Appl. No.: 232,719

[22] Filed: Aug. 16, 1988

[30] Foreign Application Priority Data

Aug. 25, 1987 [NL] Netherlands .......................... 8701986

[51] Int. Cl.$^4$ ........................ H04N 1/23; G01D 9/42; H01S 3/00; H01S 3/10
[52] U.S. Cl. .................................... 358/296; 346/108; 372/26; 372/38
[58] Field of Search .................... 358/296, 300, 302; 346/108, 160; 355/8, 14 E; 372/38, 26

[56] References Cited

U.S. PATENT DOCUMENTS 4,612,555  9/1986  Hongou ............................... 346/160

FOREIGN PATENT DOCUMENTS 013790  1/1982  Japan .
095885  6/1983  Japan .

OTHER PUBLICATIONS

Transactions of the IECE of Japan, vol. E 65, No. 10, Oct. 1982 (pp. 584–585) "Direct FM Color Video Signal Recording With Diode Lasers".
NTG-Fachberichte, vol. 59, Third European Conference on Optical Communication, Conference Proceedings 14–16 Sep. 1977 (pp. 208–210), "Laser Automatic Level Control Circuits for Optical Communications Systems".

Primary Examiner—E. A. Goldberg
Assistant Examiner—Scott A. Rogers
Attorney, Agent, or Firm—Reed Smith Shaw & McClay

[57] ABSTRACT

A control circuit for a laser printer is described which utilizes a laser switching amplifier for supplying current to a laser diode, the latter being modulated by means of image signals. The control circuit has a correction circuit which compensates for the turn-on delay time of the laser diode. Preferably, the correction circuit lengthens the incoming image signal which controls the laser diode by a correction time which substantially corresponds to the time that elapses between when current is supplied to the laser diode and when the laser diode delivers its light, thereby eliminating distortion of the final image.

5 Claims, 4 Drawing Sheets

CONTROL CIRCUIT FOR A LASER PRINTER

FIELD OF THE INVENTION

The present invention relates to a control circuit for a laser printer using a laser diode.

BACKGROUND OF THE INVENTION

U.S. Pat. No. 4,612,555 and particularly FIG. 7 thereof discloses a control circuit for a laser beam scanner apparatus. The laser printer described therein has a switching amplifier for controlling a laser diode. A variable current source is used as a common emitter resistor for the two switching transistors and a second current source is used to adjust the base current through the laser diode. A photodiode is also provided which measures the emitted amount of light. The energization current through the laser diode is determined on the basis of this measurement of the emitted amount of light.

One characteristic of a laser diode is that when a current is supplied to it, a small period of time elapses before the laser diode actually emits light. This switch-on or turn-on delay time is particularly troublesome when the laser diode is used in a high speed or high resolution laser printer. With a switch-on delay time of about 6 nsec and a writing frequency of about 10 MHz, the switch-on point of the laser lies approximately 6 $\mu$m later than expected. A broadening of the image due to this inherent time delay is visually disturbing to the eye with respect to fonts with a resolution, for example, of 20 image dots per mm.

This troublesome characteristic of an inherent turn-on delay time has not been overcome in the area of a laser diode in a laser printer. For example the Transaction of the IECE of Japan, Vol. E65, No. 10 (October 1982) at pp. 584–85 deals with the duty cycle of a diode laser in an optical disk system, not a laser printer. Similarly the Conference Proceedings of the Third European Conference On Optical Communication (Sept. 14–16, 1977) NTC-Fachberichte Band 59 at pp. 208–10 relates to optical communication systems, wherein the main requirement is that the turn-on delay be as short as possible so that the light pulses fall within the appropriate time slot. Other image recording devices are described in U.S. Pat. Nos. 4,387,983 and 4,594,596.

It would be desirable, therefore, to provide a control circuit for a laser printer using a laser diode wherein the inherent time delay as well as other disadvantages are obviated.

SUMMARY OF THE INVENTION

The present invention provides a correction circuit which is used in a control circuit for a laser printer having a switching amplifier for supplying current to a laser diode, the latter being modulated by means of an image signal. The correction circuit performs the function of lengthening the image signal by a correction time which substantially corresponds to the time period between when current is first supplied to the laser diode and when the laser diode emits (i.e., the turn-on delay time). As a result of this correction, the line written by the laser printer corresponds exactly to the image information supplied, there is no broadening or distortion of the image and the base current adjustment to the switching amplifier can be effected less critically.

Other details, objects and advantages of the present invention will become more readily apparent from the following description of a presently preferred embodiment thereof.

BRIEF DESCRIPTION OF THE DRAWINGS

In the accompanying drawings, a preferred embodiment of the present invention is illustrated, by way of example only, wherein.

DESCRIPTION OF THE PREFERRED EMBODIMENT

Figure 1:
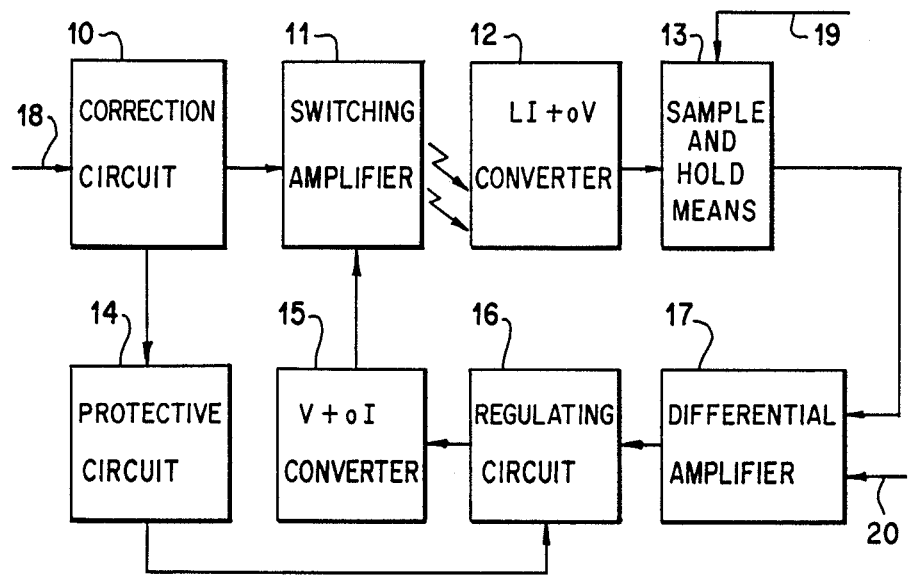
FIG. 1 is a block diagram of a control circuit using the present invention.

FIG. 1 is a block diagram of a control circuit which utilizes the present invention. Typically, a control circuit of this kind is used in a laser printer to control a laser diode which is modulated by means of an image or video signal. The modulated laser beam is deflected linewise over a photo-sensitive medium by means of a polygonal mirror. The laser diode is driven by a laser switching amplifier 11. Preferably, the laser diode is disposed in an envelope which also contains a photodiode which delivers a feedback signal related to the amount of light emitted by the laser diode. The feedback signal is converted into a voltage by a light intensity-to-voltage converter 12. This feedback voltage is fed to a sample-and-hold means 13. After an image line has been written, a sampling is fed via a line 19 to the sample-and-hold means 13. The feedback voltage which was present at the time of sampling is retained until the next sampling signal. The sampled feedback voltage is fed to a differential amplifier 17 and is compared with a reference signal fed via line 20. This reference signal represents the required light output of the laser diode. In the event of an inequality of the two signals a differential signal is generated and is fed to a regulating circuit 16. Regulating circuit 16 delivers a d.c. voltage which is fed to a voltage-to-current converter 15. The current generated therein acts as a switching current for the laser diode. If the laser diode output is too low, the current will increase via circuits 12, 13, 17, 16 and 15 so that the light output of the laser diode increases.

The regulating system described above corrects the light output on each image line while the response time of the regulating circuit is equivalent to a number of image lines. The image signal is first fed via line 18 to a correction circuit 10 before being fed to the rest of the control circuit. As will be described hereinafter, the correction circuit 10 compensates for the turn-on delay of the laser diode. The corrected image signal is fed as a modulation signal to the laser switching amplifier 11. The image signal is also fed from the correction circuit 10 to a protective circuit 14, with the output of the latter being connected to the regulating circuit 16.

Figure 2:
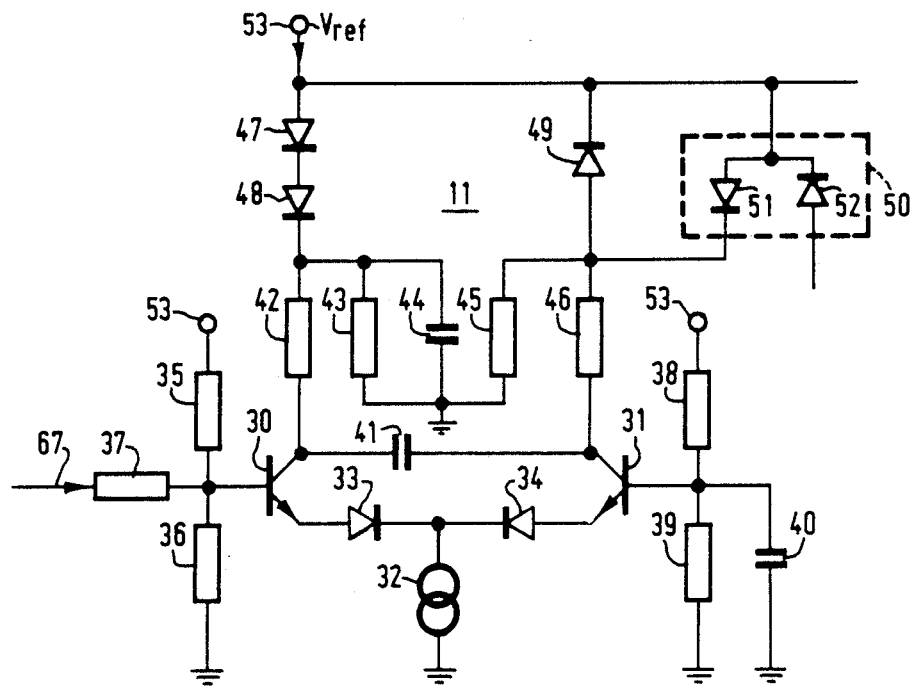
FIG. 2 is a circuit diagram of a laser switching amplifier used in the control circuit of FIG. 1.

FIG. 2 shows a circuit diagram for a typical laser switching amplifier used in the control circuit of FIG. 1. The main portion of this circuit is formed by a differential amplifier having a common current source 32 in the emitter leads of transistors 30 and 31. The right-hand chain of the differential amplifier is formed by transistor 31, resistors 45 and 46, and laser diode 51. The left-hand chain of the differential amplifier is formed by transistor 30, resistors 42 and 43, capacitor 44, and diodes 47 and 48. The base of transistor 31 is at a fixed potential due to a voltage divider formed by resistors 38 and 39. Preferably, the voltage divider is connected to a reference voltage source 53 while the base is connected to a capacitor 40 in order to ensure a stable potential on the base of transistor 31. The collector lead of transistor 31 contains a collector resistor 46 connected in series with a protective diode 49 which is connected in the cut-off direction to the reference voltage 53. The base of the input transistor 30 is also at a fixed potential due to a voltage divider formed by resistors 35 and 36. The modulation signal is fed to the base of transistor 30 via resistor 37.

If the modulation signal on line 67 is higher than the voltage on the base of transistor 31, transistor 30 will be turned on (i.e. it will conduct) and transistor 31 will be cut off. The current through transistor 30 is determined by the current source 32. In this configuration, current flowing through the laser diode 51 and resistor 45 will have a value which is determined only by the reference voltage 53 and resistor 45. The current flowing through the laser diode will not be determined by current source 32.

If the modulation signal on line 67 causes the base voltage of transistor 30 to fall below the base voltage of transistor 31, transistor 30 will be cut off and transistor 31 will be turned on (i.e. conduct). The current which flows through the laser diode 51 is now determined by the current source 32 since the value of resistor 45 is much larger than the value of the collector resistor 46. Diodes 33 and 34 decouple the base-emitter capacitances of the transistors 30 and 31 to prevent current oscillations.

To obtain ideal switching characteristics for the laser switching amplifier 11, the circuit of FIG. 2 is made symmetrical. This ensures that both the leading and trailing flanks of the current pulse through the laser diode 51 are substantially identical for a symmetrical input pulse on line 67 of 10 MHz. Diodes 47 and 48 and capacitor 44 create the same load for transistor 30 as the laser diode 51 does for transistor 31. Similarly, resistor 43 is equal to resistor 45 in order to give a dynamic load in the left-hand chain identical to the dynamic load in the right-hand chain. This also ensures that there is always a voltage drop across the load even when the current through the current source 32 is absent or at times when transistor 30 and transistor 31 operate in the switching zone. The symmetrical filter formed by resistors 42, 46 and capacitor 41 reduces the current overshoot to a negligible value.

Figure 7:
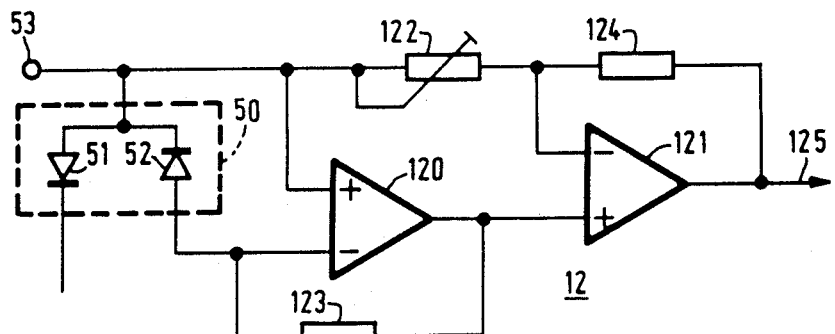
FIG. 7 is a circuit diagram of a light intensity-to-voltage converter used in the control circuit of FIG. 1.

When the laser diode 51 is on, the photodiode 52 which is disposed in a housing 50 with the laser diode 51 will deliver a photocurrent to the light intensity-to-voltage converter 12 which represents the amount of light emitted by the laser diode. In this LI to V converter 12, an example of which is shown in detail in FIG. 7, the photodiode current is fed to the inverting input of an amplifier 120 which together with resistor 123 converts this current into a feedback voltage. Amplifier 121, the gain of which can be set by means of a potentiometer 122 and a resistor 124, gives an output signal on line 125 whose value at the maximum light output of laser diode 51 is equivalent to a predetermined voltage.

Figure 8:
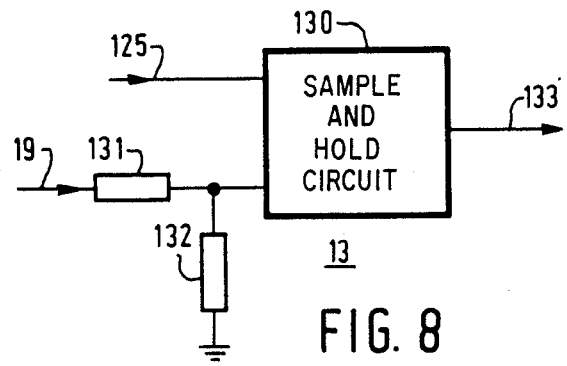
FIG. 8 is a circuit diagram of a sample-and-hold circuit used in the control circuit of FIG. 1.

The output signal on line 125 is fed to a sample-and-hold circuit 130 such as the one shown in FIG. 8. After each written line, a sampling pulse is fed to the sample-and-hold circuit 130 via a line 19 and a voltage divider formed by the resistors 131 and 132. When a sampling pulse is received, the instantaneous value of the feedback voltage on line 125 is made available on line 133.

Figure 9:
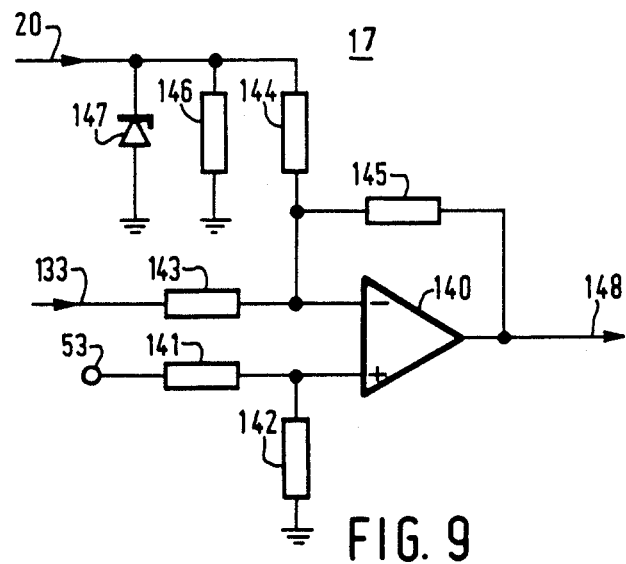
FIG. 9 is a circuit diagram of a differential amplifier used in the control circuit of FIG. 1.

The sampled feedback voltage is fed to the inverting input of a differential amplifier 140 such as the one shown in FIG. 9 via a resistor 143. In addition, a reference voltage is fed to the inverting input of the amplifier 140 via line 20 and a voltage divider formed by resistors 146 and 144. The value of the reference voltage, preferably, is related to the required current through the laser diode. The difference between the two voltages is amplified by differential amplifier 140 by an amount related to resistor 145. Zener diode 147 prevents the output voltage on line 148 from being excessive which could happen if an excessive reference voltage was used on line 20. This also prevents the current through the laser diode from exceeding a maximum value. The differential amplifier 140 is set to a fixed base line voltage by a voltage divider formed by the resistors 141 and 142 and reference voltage 53.

Figure 10:
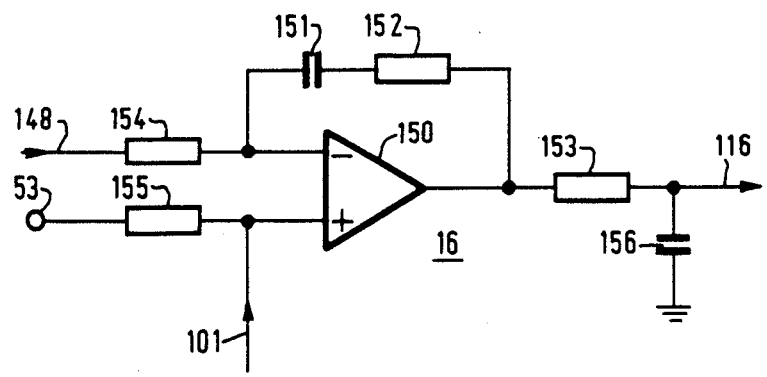
FIG. 10 is a circuit diagram of a regulating circuit used in the control circuit of FIG. 1.

The differential voltage on line 148 is fed to a regulating circuit 16 such as the one shown in FIG. 10. This regulating circuit is constructed as an integrator around operational amplifier 150, resistor 152 and capacitor 151. The speed of regulation of the integrator is determined by resistors 152, 154 and capacitor 151. The integrated signal is flattened by a filter formed by resistor 153 and capacitor 156. The positive input of the operational amplifier 150 is connected to a reference voltage 53 via a resistor 155 and also to a protective circuit 14 via line 101.

Figure 6:
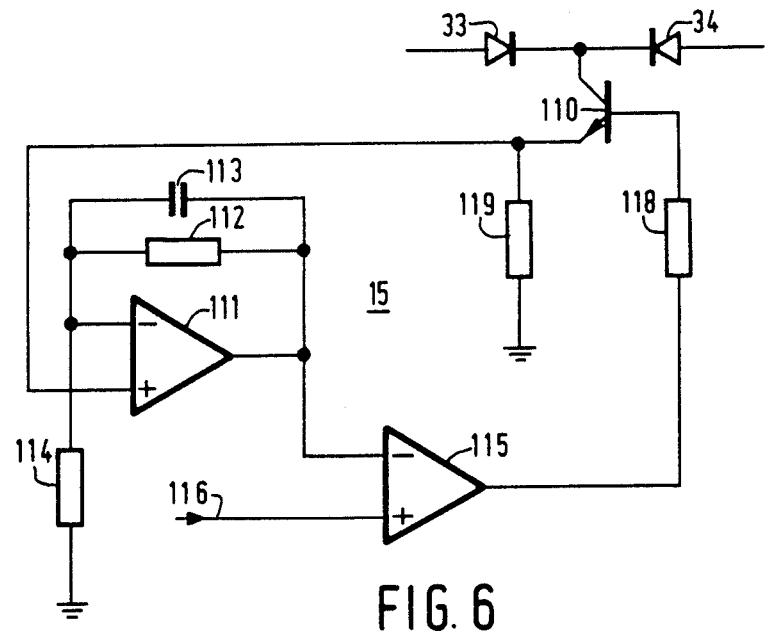
FIG. 6 is a circuit diagram of a voltage-to-current converter used in the control circuit of FIG. 1.

The output signal of regulating circuit 16 is fed via line 116 to a voltage-to-current converter 15 such as the one shown in FIG. 6. V to I converter 15 regulates the current through the laser diode 51 in such manner as to give a constant light output. A variable current source is formed by transistor 110, resistor 119 and two operational amplifiers 111 and 115. Capacitor 113 serves to stabilize the circuit. The range of regulation of the current source is such that even at the end of the life of the laser diode there is still sufficient current available to provide the maximum light output from the laser diode.

Figure 3:
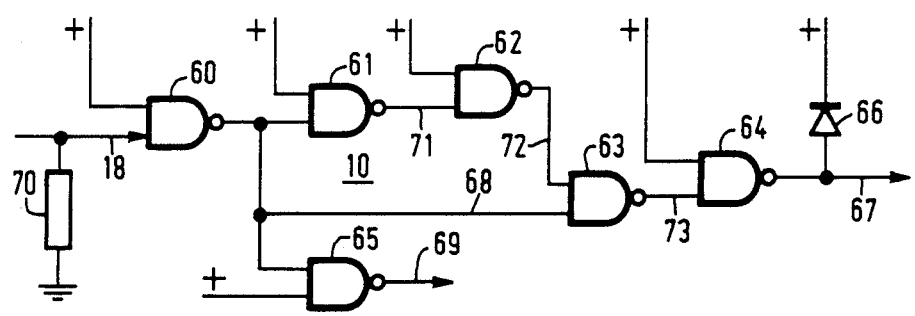
FIG. 3 is a circuit diagram of a correction circuit used in the control circuit of FIG. 1.
Figure 5:
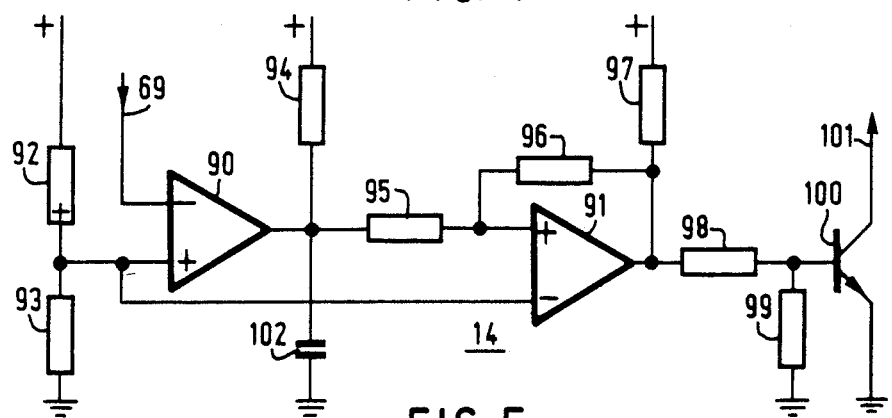
FIG. 5 is a circuit diagram of a protective circuit used in the control circuit of FIG. 1.

The image signal is fed through correction circuit 10 (as shown in FIG. 3) and then over line 69 to a protective circuit 14 such as the one shown in FIG. 5. There, the image signal is fed to the inverting input of operational amplifier 90, which is constructed as a comparator circuit, where it is compared with a d.c. voltage on the noninverting input of the operational amplifier 90. This d.c. voltage is adjusted by means of resistors 92 and 93. If no image signal is supplied (i.e. when the laser printer and laser diode are off), capacitor 102 will be slowly charged up via resistor 94. If this voltage, which is fed via resistor 95 to the noninverting input of a second operational amplifier 91, is higher than the voltage on the inverting input, the output of this second operational amplifier goes high and transistor 100 will conduct. Since the collector of transistor 100 is connected via line 101 to the noninverting input of operational amplifier 150 (see FIG. 10), the voltage at this point will decrease and the current source will be switched off. This switching-off time occupies approximately two image line times.

Figure 4:
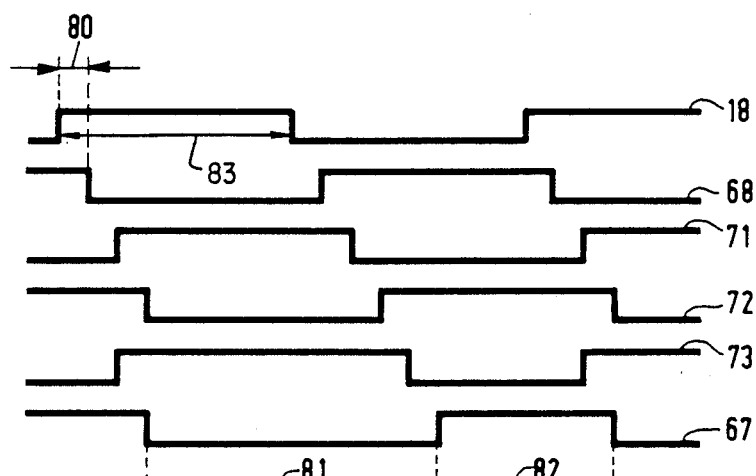
FIG. 4 is a timing diagram showing the shape and relative positions of the signals which occurs in the correction circuit of FIG. 3.

When current is first fed to the laser diode 51, it takes about 6 nsec before the laser diode emits or delivers light. However, when the current is switched off, the light output decreases to zero immediately without delay. In order to correct for this anomaly, correction circuit 10, such as the one shown in FIG. 3, is added to the control circuit as shown in FIG. 1. A symmetrical image signal (see the first line of FIG. 4) is fed to a NAND gate 60 via line 18. The output of this signal on line 68 is inverted and delayed for a time period 80 with respect to the original image signal. This time period 80 is approximately 3 nsec and is due to the gating delay of NAND gate 60. This signal is fed through two more NAND gates 61 and 62 and then via line 72 to an input of a third NAND gate 63. The signals on lines 71 and 72 are thus always delayed for an additional gating time period 80 with respect to their respective input signal. The signal on line 68 is fed to the other input of NAND gate 63. The leading flank of the resulting signal on line 73 is thus delayed for twice the time period 80 (i.e., 6 nsec) and the trailing flank is delayed for four times time period 80 (i.e., 12 nsec) with respect to the original image signal. Since a "low" signal is required for the laser diode to emit light, the signal on line 73 is inverted again by means of NAND gate 64 and the resulting corrected image signal or modulation signal becomes available on line 67.

The time period 81 is thus lengthened by 2×3 nsec=6 nsec, with respect to the corresponding time period 83 of the original image signal. When measured from the switching-off time, the current through the laser diode 51 is switched on 6 nsec earlier than when measured from the switching-off time of the original image signal. Thus, the light delivery starts at exactly the right time. The off time 82 is correspondingly shortened by 6 nsec.

For the correction described above to work properly, it is important that the leading and trailing flanks of the image signal by symmetrical with respect to one another. This can be achieved by gating the image signal with the laser printer clock signal. In this way any image pulse distortion caused by supply lines which stray capacities is completely eliminated.

The present invention is not limited to the preferred embodiment described above. For example, the correction can also be achieved by allowing the trailing flank of the (inverted) image signal always to go high again 6 nsec later by means of a timing circuit. The correction can also be performeed dynamically. For example, the number of pulses delivered by a high frequency (HF) clock signal generator can be counted by an up-down counter in the time period elapsing between the image signal going high and the laser diode 51 going on (determined via the photodiode 52 or another externally disposed diode). When the image signal goes low the counter is switched over to a down-counter and the energizing signal remains high until the counter has counter down to the zero position. The counter is synchronized with the HF clock pulses.

While a presently preferred embodiment of practicing the invention has been shown and described with particularity in connection with the accompanying drawings, the invention may otherwise be embodied within the scope of the following claims.

What is claimed is:

1. A control circuit for a laser printer comprising a laser switching amplifier for supplying current to a laser diode, the laser switching amplifier comprising a differential amplifier having two chains connected to a common current source, the first chain comprising a first switching element and the laser diode and the second chain comprising a second switching element and a plurality of correction elements which represent substantially the same dynamic load for the second switching element in the second chain as the laser diode represents for the first switching element in the first chain.

2. A control circuit as described in claim 1, wherein the correction elements comprise two diodes connected in series to the second switching element and a capacitor which is grounded at one end while the other end is connected to the junction of the electrical connection between the second switching element and the two diodes.

3. In a control circuit for a laser printer utilizing a laser switching amplifier for supplying current to a laser diode and wherein the laser diode is modulated by means of an image signal, the improvement comprising a correction circuit for lengthening the image signal by a correction time substantially corresponding to the time that elapses between when current is supplied to the laser diode and when the laser diode emits light, the correction circuit comprising a delay circuit for delaying by the correction time a trailing flank of the image signal with respect to a leading flank of the image signal, the delay circuit comprising three NAND gates connected in series and wherein the image signal is fed simultaneously to the first and the last NAND gates.

4. In a control circuit for a laser printer utilizing a laser switching amplifier for supplying current to a laser diode, having a photodiode disposed near the laser diode which delivers an output signal related to the light output of the laser diode, and wherein the laser diode is modulated by means of an image signal, the improvement comprising a correction circuit for lengthening the image signal by a correction time substantially corresponding to the time that elapses between when current is supplied to the laser diode and when the laser diode emits light, wherein the correction circuit determines the correction time from the time elapsing between arrival of the image signal at the control circuit and the rise of the output signal of the photodiode.

5. A control circuit as described in claim 4, wherein the correction circuit comprises a high frequency clock signal generator for generating a plurality of clock pulses, and an up-down counter, the counter determining the correction time counting, in one direction, the number clock pulses occurring during the time between the arrival of the image signal at the control circuit and the rise of the outpt signal of the photodiode, and after the end of the image signal, the counter counting in the opposite direction, the same number of clock pulses such that the image signal is lengthened during the counting in the opposite direction by the correction time.

* * * * *